United States Patent
Cheng et al.

(10) Patent No.: US 7,367,118 B2
(45) Date of Patent: May 6, 2008

(54) METHOD FOR FORMING METAL WIRES BY MICRODISPENSING PATTERN

(75) Inventors: Kevin Cheng, Hsinchu (TW);
Ming-Huan Yang, Hsinchu (TW);
Wan-Wen Chiu, Hsinchu (TW); Jane Chang, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 513 days.

(21) Appl. No.: 10/864,331

(22) Filed: Jun. 10, 2004

(65) Prior Publication Data
US 2005/0120550 A1 Jun. 9, 2005

(30) Foreign Application Priority Data
Dec. 5, 2003 (TW) .............................. 92134442 A

(51) Int. Cl.
*H05K 3/10* (2006.01)
(52) U.S. Cl. .......................... 29/846; 29/825; 427/304; 427/305; 427/306
(58) Field of Classification Search ................. 29/846, 29/825; 428/212, 402, 402.2, 402.21, 402.24, 428/403, 404, 405, 406, 407, 430, 458, 483; 427/304–306
See application file for complete search history.

(56) References Cited

U.S. PATENT DOCUMENTS

| | | | |
|---|---|---|---|
| 4,668,532 A * | 5/1987 | Moisan et al. ............... | 29/852 |
| 4,888,209 A * | 12/1989 | Neely .......................... | 428/433 |
| 5,132,248 A | 7/1992 | Drummond et al. | |
| 5,831,070 A * | 11/1998 | Pease et al. ................ | 536/25.3 |
| 6,521,285 B1 | 2/2003 | Biebuyck et al. | |
| 7,112,361 B2 * | 9/2006 | Lynn et al. .................. | 428/212 |

FOREIGN PATENT DOCUMENTS

| | | |
|---|---|---|
| CN | 119879 A1 | 4/1996 |
| CN | 1459824 A | 12/2003 |
| JP | 10-150278 A | 6/1998 |

* cited by examiner

*Primary Examiner*—Rick K. Chang
(74) *Attorney, Agent, or Firm*—Birch, Stewart, Kolasch & Birch, LLP

(57) ABSTRACT

A method of forming a metal wire by microdispensing a pattern is provided. In the method, a substrate has been treated by SAM is firstly provided. Then, a catalytic agent is microdispensed on the surface of the substrate at places for forming a metal wire, and a catalytic pattern is rendered. Next, a metal wire on the catalytic pattern by an electroless plating process is formed, and a vibration in a period of ink-jet discharging and ink drying during the step of microdispensing is provided. In addition, the vibration is generated by an apparatus which includes forming a metal wire on the catalytic pattern by an electroless plating process, and providing a vibration in a period of ink-jet discharging and ink drying during the step of microdispensing, wherein the vibration is generated by an apparatus which includes a supportive frame and a vibration generation module.

30 Claims, 3 Drawing Sheets

METHOD FOR FORMING METAL WIRES BY MICRODISPENSING PATTERN

This Non-provisional application claims priority under 35 U.S.C. § 119(a) on Patent Application No(s). 092134442 filed in Taiwan on Dec. 5, 2003, the entire contents of which are hereby incorporated by reference.

BACKGROUND OF THE INVENTION

1. Field of Invention

The invention relates to a method for forming metal wires and, in particular, to a method for forming metal wires by microdispensing a pattern on substrate.

2. Related Art

Classical PCB processes include the step of dry metal film attach to substrate, spin photo resist, mask pattern & development, etching photo resist, the second metal plating, and cleaning resist etc. complex processes. For many years, screen-printing and photolithography have been the predominant methods of imaging in PCB manufacturing processes. These techniques have served the industry well and provided the desired image resolution at an acceptable cost. Both methods have their own individual strengths and weaknesses and manufacturers select the most appropriate process for their requirements in primary track imaging, solder mask application and legend printing. These methods suffer from the drawback of being analogue processes and hence require conversion from a digital data file to converted printable image via initial production of a screen or photo tool. This adds cost and time delays to the preparation of boards particularly prototype and short run board production.

As electronic devices become more compact and lighter, the PCB is forced to have smaller hole diameters, higher densities, more layers, and thinner circuit lines. In general, the PCB uses glass fiber cloths or soft materials to form a flat substrate, and then using an adhesive agent or hot press to form a metal layer or copper foil attached to the substrate. The metal layer is then etched to form the desired metal wires. However, halide is added into the ingredients of the adhesives. This is incompatible with the rule that halide are forbidden in all electronic products set by the Europe standard in 2004. Moreover, the adhesives are often added with ionic impurities. This makes the substrate have worse dielectric and insulating properties and be likely to deform at high temperatures. All such facts will reduce the reliability of the substrate. At the same time, because of chemical etching occurred to the adhesives, the metal junction strength gets lower.

Therefore, a metal layer can be formed on the surface of the substrate by deposition and photolithography etching. Electroless plating or sometimes called chemical plating is a method to deposit a metal layer. Without imposing an external voltage, the metal ions in a solution are deposited on the surface of a solid through an autocatalytic chemical reaction. Such a reaction is very similar to electroplating. These materials in the solution have oxidization/reduction reactions on the surface of the solid, the electrons directly transmit on the surface and it is therefore different from electroplating using an external field. To satisfy the thin line requirement on the circuit board, the mask preparation and metal layer etching become harder. Moreover, different types and sizes of metal wires require different masks. This inevitably increases the manufacturing costs.

Using the properties of electroless plating, a method of directly forming a metal pattern on the substrate as the metal wires is developed. As electroless plating has to be performed on an activated or catalyzed surface, one can selectively form a catalytic layer at places for growing metal wires before electroless plating. As disclosed in the U.S. Pat. No. 6,521,285, a selective electroless plating means first forms a print mold with the metal wire pattern. The print mold, coated with a catalytic agent, stamps on the substrate, so that the substrate surface is printed with a catalytic layer for forming metal wires. Finally, a metal layer is grown on the surface of the catalytic agent in an electroless plating means. This method also requires the uses of different print molds for different types and sizes of metal wire catalytic agents. The line width of the circuit is determined by the precision in carving the print mold.

SUMMARY OF THE INVENTION

The invention discloses a method of forming metal wires by microdispensing a pattern. A catalyst pattern is microdispensed at places to form metal wires on the substrate. The metal wires are formed using an electroless plating procedure.

The disclosed method includes the steps of: providing a substrate; microdispensing a catalytic pattern for forming metal wires; and depositing metal on the catalytic pattern on the surface of the substrate by an electroless plating process. In order for the metal to adhere onto the substrate and to improve the surface properties of the substrate, the substrate surface has to be appropriately treated (i.e. modification treatment) before microdispensing.

The invention modifies the surface properties by forming a self-assembled monolayer (SAM) interface on the substrate surface. The SAM layers treat the surface has a special nanometer interface structure due to the chemical dynamics difference among the atoms. The layers structure has a nanometer thickness coating on the surface. The film forming mechanism of the SAM is the chemical adsorption at the interface between the solid and liquid phases. A two-dimensional ordered molecular layer with atoms closely packed by chemical bonds. Controlling to form such SAM repeatedly can form a multi-layer interface structure at the nanometer scale. One can use the components, structure, physical and chemical properties of the film interface to change the surface properties of the substrate. The substrate surface is thus endowed with selective absorption abilities. Therefore, the substrate can effectively absorb a catalytic agent.

By microdispensing a catalytic agent at places to form metal wires, It needs several minutes to dry and Pd nucleation residual on surface. In this invention, to enhance this homogeneous distribution of Pd nucleation, a vibration device likes PZT is operated beneath on the substrate during drying period. Besides, by electroless plating, the width and thickness of the metal wire can be controlled and its resistance can be reduced. The combination of microdispensing and electroless plating can shorten the metal wire preparation time and increase its yield in comparison with the conventional photolithography and etching processes.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
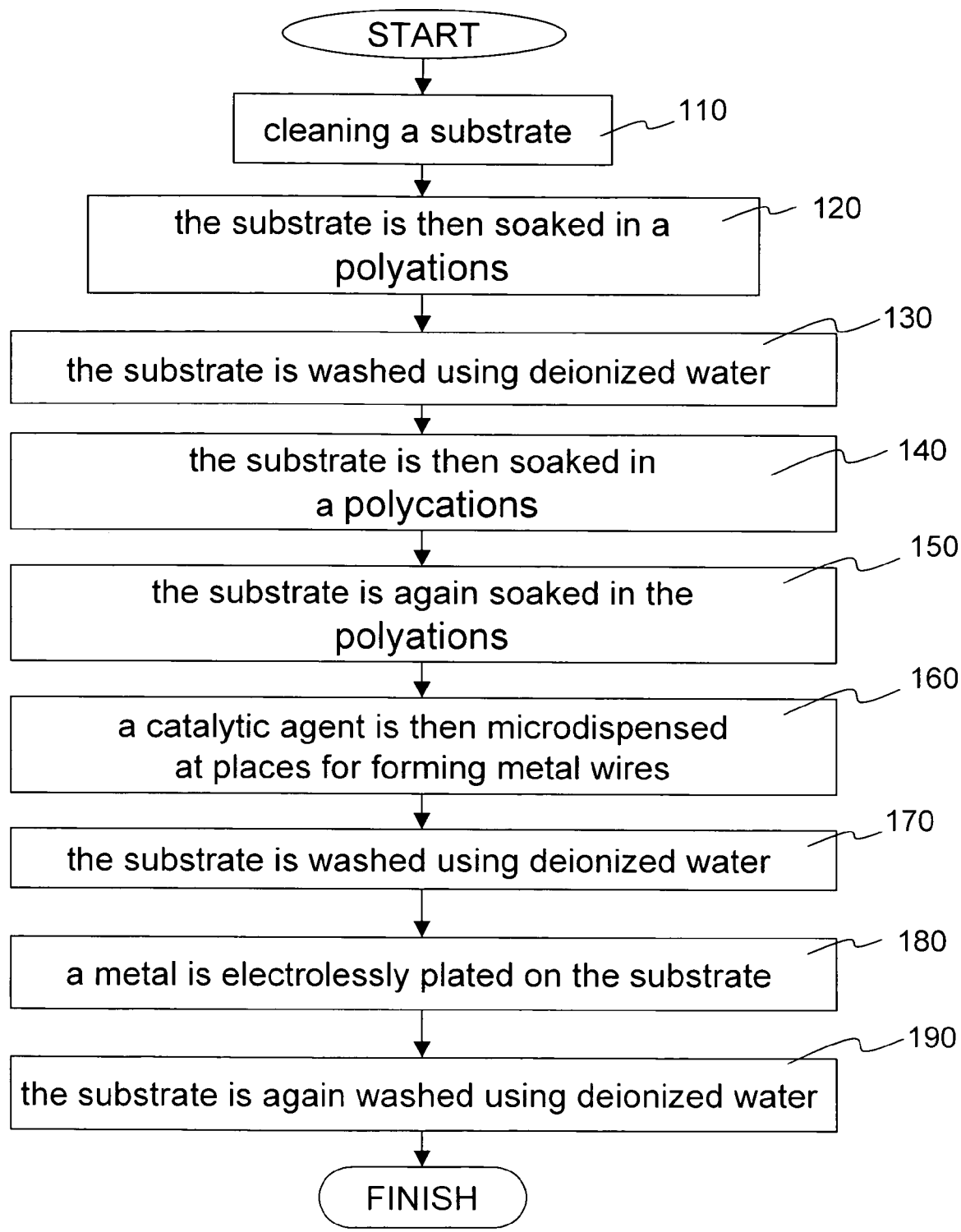
FIG. 1 is a flowchart of the disclosed method of microdispensing a metal wire pattern.

With reference to FIG. 1, the disclosed metal wire formation method starts by cleaning a substrate (step 110). It is done by a 10-minute UV-ozone treatment. The substrate is then soaked in a polyanions (step 120). The polyanions is a 10 milli-M polyacrylic acid (PAA). Afterwards, the substrate is washed using deionized water (step 130). The substrate is then soaked in a polycations (step 140). The polycations is a 10 milli-M polyallylamine hydrochloride (PAH). The substrate is again soaked in the polyanions solution (step 150). A catalytic agent is then microdispensed at places for forming metal wires (step 160). The catalytic agent is a 10 milli-M sodium tetrachloropalladate ($Na_2PdCl_4$) solution. Afterwards, the substrate is washed using deionized water (step 170). The substrate is then soaked in a HCl solution with a pH value between 2.5 and 3 for 30 seconds. A metal is electrolessly plated on the substrate (step 180). Finally, the substrate is again washed using deionized water (step 190).

In the above procedure, steps 120 to 140 are performed to treat the surface of the substrate, forming a self-assembled monolayer (SAM) thereon to change its surface properties. With different materials for the substrate, the order of using the anionic and polycations may be reversed. After being treated by polymer electrolyte solutions of two different polarities, the substrate is formed with an SAM on its surface. In the above procedure, one can repeat steps 120 to 140 to stack on the substrate surface several PAH/PAA bilayers. Afterwards, step 150 is performed to form a multi-layer SAM interface at the nanometer scale. One may select the SAM interface structure for different substrate materials. The PAH/PAA bilayers can be used on glass substrates, PET substrates, organic FR-4 substrates, flexible FR-4, and polyamide substrates. Moreover, the polycations can be PAH (polyallylamine hydrochloride), $PVI^+$(polyvinylimidazole PVI), $PVP^+$(poly(vinylpyrrolidone) (PVP)), and PAN (polyaniline) solution; the polyanions can be PAA(polyacrylic acid), PMA(Polymethacrylic acid), and PTAA(poly(3-thiopheneacetic acid) (PTAA)) solution.

The invention coats the catalytic agent at places to form metal wires by inkjet printing. Since the catalytic agents are generally salts and almost water soluble, they have good inkjet stabilities. The properties of the metal wire formed in the subsequent electroless plating process are determined by the inkjet resolution and treated surface properties. The current inkjet technique can achieve a very high resolution. Therefore, the invention can be used to make high-density, thin-width metal wires. Moreover, to increase the flatness of the catalytic agent being coated on the substrate, vibration-induced in appropriate frequency and amplitude during the inkjet process can destroy the surface tension of the micro droplets on the substrate, rendering a more homogeneously distributed of Pd nucleation and form a more flat metal film after electroless plating.

Figure 2:
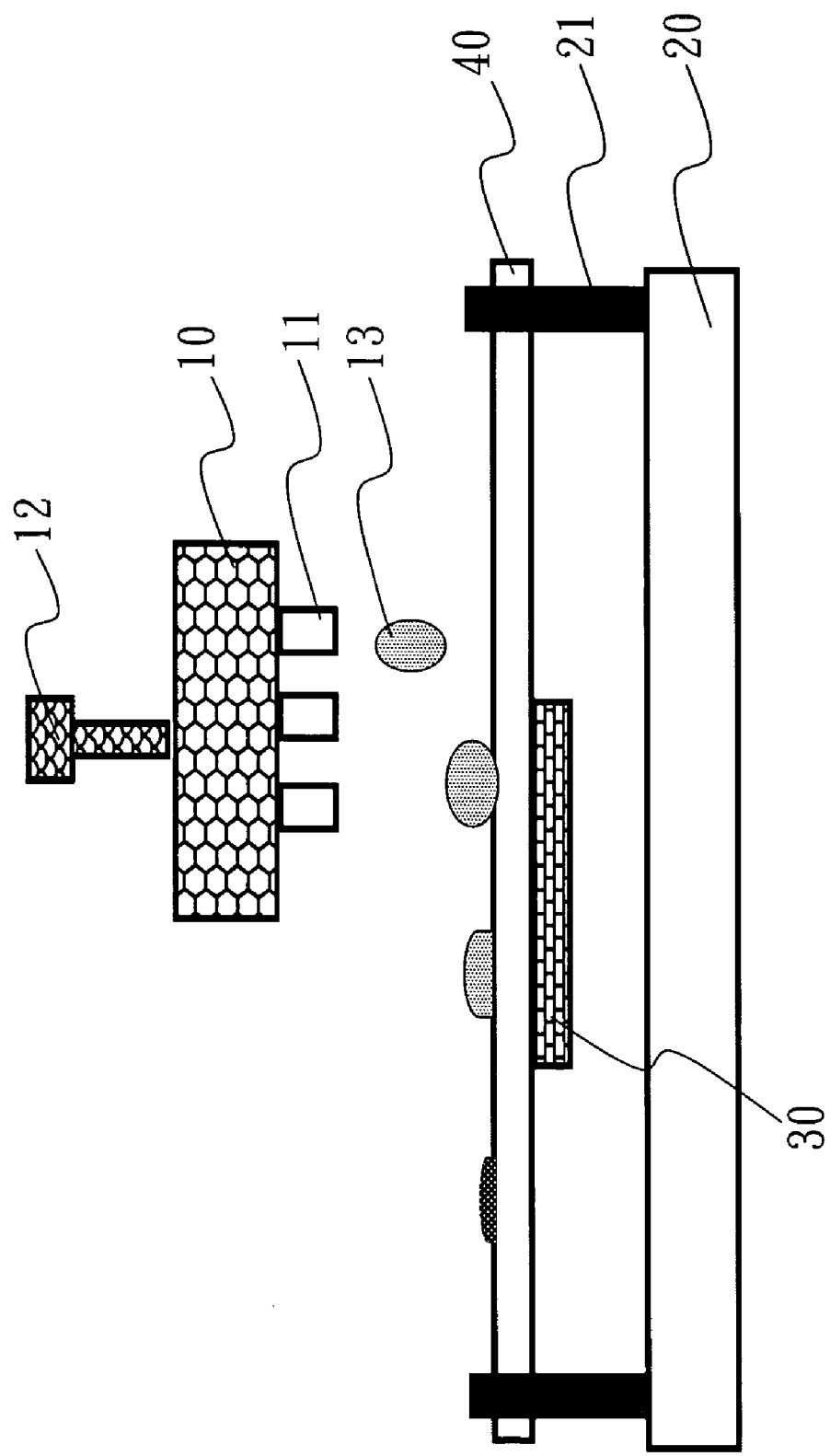
FIG. 2 is a schematic view of the device for microdispensing a metal wire pattern.

As shown in FIG. 2, the device used to microdispensing the catalytic agent pattern includes an inkjet head module 10, a motion support 20, a supportive frame 21, and a vibration generation module 30. The inkjet head module 10 has more than one nozzles 11 and is fixed on an inkjet head adjusting mechanism 12 so as to spray catalytic droplets on the substrate 40. The motion support 20 supports the substrate 40 and is adjustable so that the inkjet head module 10 can properly microdispense the catalytic droplets 13. It has the supportive frame 21 for the substrate to be installed, keeping the substrate 40 from the motion support 20 by a distance. The vibration generation module 30 is a bend mode PZT plate attached under the substrate 40. The vibration generation module 30 is not in contact with the micro fluid support 20, avoiding unnecessary energy damping. The action of the vibration generation module 30 produces vibrations of an appropriate frequency. The nozzles 11 discharges catalytic droplets 13 to the substrate 40 to form a catalytic pattern. The substrate 40 can further equips a temperature control module (not shown) to speed up the catalyst evaporation rate (baking) or slow down the catalyst flowing to get more uniform distribution of Pd nucleation (cooling). Moreover, the vibration generation module could include at least one vibration component, to generate various frequency and amplitudes. Once the solvent in the catalytic droplets evaporates, one obtains a flat catalytic pattern. The above procedure uses the $Na_2PdCl_4$ or $Pd(NH_3)_4Cl_2$ solution as the catalytic agent, which uses the Nd atoms to catalyze electroless plating of copper.

The electroless plating is also called the chemical plating or autocatalytic plating. The electroless plating refers to the process of chemically reducing metal ions in a solution to form a coating on a substrate in a controlled plating solution environment. The ingredients in normal electroless plating solutions mainly include metal ions as the source of coating metal, a reducing agent for reducing metal ions back to atoms, and a catalyst for catalyzing the substrate surface. To maintain the stability of the plating solution, it further contains a complexing agent to prevent the precipitation of hydro-oxygen compounds, to adjust the plating speed, and to stabilize the plating solution. It also contains a stabilizer to adsorb impurity particles to prevent the plating solution from natural dissolution and to elongate its lifetime. Finally, it contains a buffer that controls the pH value within an operating range. To enrich the properties of the plating layer, a wetting agent and a brightener are added to improve the surface action and brightness.

Figure 3:
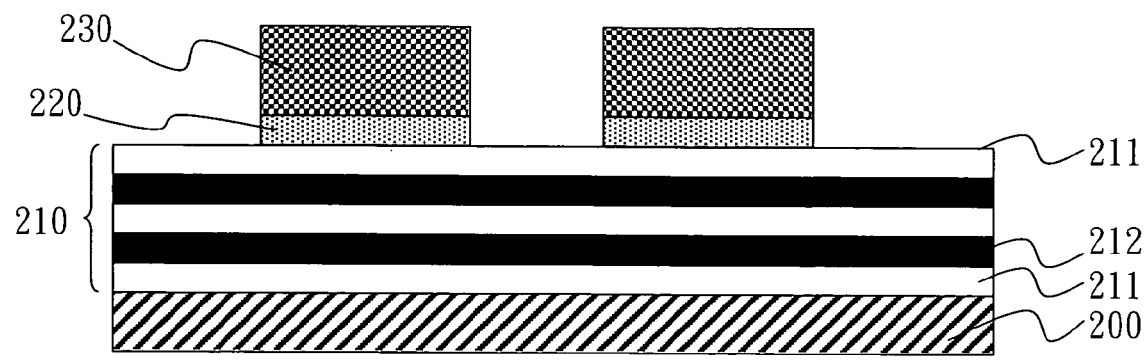
FIG. 3 is a schematic cross-sectional view of the circuit board in the first embodiment of the invention.

The electroless plating solution has to be stable. It cannot undergo reactions when not in use. It should function only when in contact with a catalytic surface. The invention first treats the surface of the substrate and microdispense a catalytic agent at places for forming metal wires. Afterwards, a metal is selectively deposited on the surface of the catalytic agent to form the metal wires. FIG. 3 is a cross-sectional view of the circuit board according to the first embodiment of the invention. After surface treatment, the substrate 200 has a multi-layer SAM 210 comprised of PAA layers 211 and PAH layers 212. The metal catalytic pattern 220 is adhered on the multi-layer SAM 210, and the first metal wire 230 is formed on the metal catalytic pattern 220.

Figure 4:
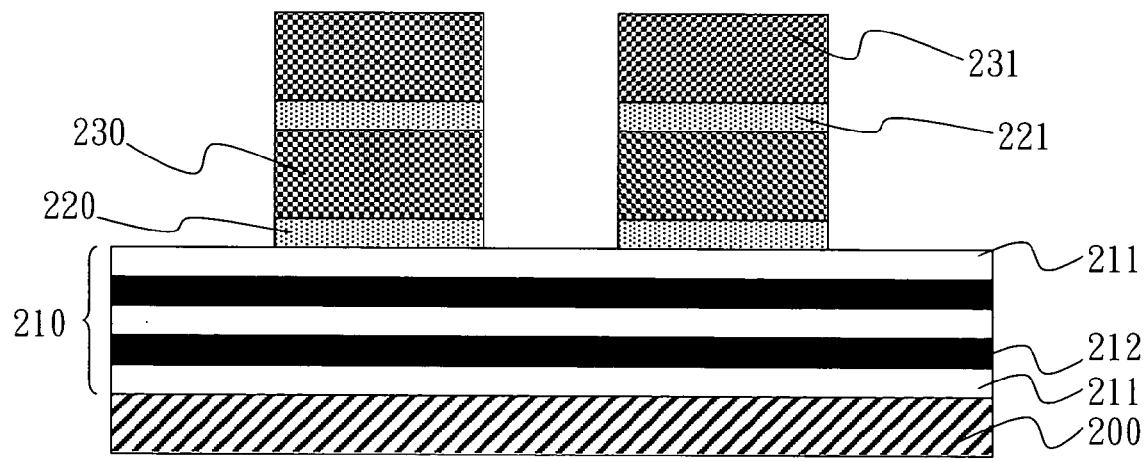
FIG. 4 is a schematic cross-sectional view of the circuit board in the second embodiment of the invention.

After a period of time, the metal deposition speed decreases in the electroless plating process. Using the disclosed method, as shown in FIG. 4, one can coat another layer of metal catalytic pattern 221 over the first metal wire. Afterwards, a second electroless plating is performed to form a second metal wire 231. At the same time, besides using the same catalytic agent and the electroless plating solution to increase the thickness of the metal wire pattern, one can select different catalytic agents and electroless plating solutions so that the first metal wire and the second metal wire can be made of the same or different metals.

Certain variations would be apparent to those skilled in the art, which variations are considered within the spirit and scope of the claimed invention.

What is claimed is:

1. A method of forming a metal wire by microdispensing a pattern, which comprises the steps of:
   (a) providing a substrate has been treated;
   (b) microdispensing a catalytic agent on the surface of the substrate at places for forming a metal wire, rendering a catalytic pattern;
   (c) forming a metal wire on the catalytic pattern by an electroless plating process; and
   (d) providing a vibration in a period of ink-jet discharging and ink drying during the step of microdispensing, wherein the vibration is generated by an apparatus which comprises:
      a supportive frame, which supports the substrate; and
      a vibration generation module, which provides a vibration in a period of catalyst drying to flatten the catalytic pattern on the surface of the substrate.

2. The method of claim 1 further comprising the step of treating a surface of the substrate to form a self-assembled monolayer (SAM) on the substrate surface for the catalytic agent to be effectively adsorbed thereon.

3. The method of claim 2, wherein the step of treating a surface of the substrate comprises the steps of:
   (a) soaking the substrate in polyanions;
   (b) soaking the substrate in polycations;
   (c) repeating steps (a) and (b) at least once; and
   (d) soaking the substrate in the polyanions.

4. The method of claim 3, wherein the polyanions is selected from the group consisting of PAA (polyacrylic acid), PMA (Polymethacrylic acid), and PTAA (poly(3-thiopheneacetic acid) solution.

5. The method of claim 3, wherein the polycations is selected from the group consisting of PAH (polyallylamine hydrochloride), PVI+(polyvinylimidazole PVI), PVP+(poly(vinylpyrrolidone) (PVP)), and PAN (polyaniline) solution.

6. The method of claim 3, wherein the substrate is selected from the group consisting of a glass substrate, a PET substrate, an FR-4 substrate, a flexible FR-4 substrate, and a polyimide substrate.

7. The method of claim 2, wherein the step of treating a surface of the substrate comprises the steps of:
   (a) soaking the substrate in polycations;
   (b) soaking the substrate in polyanions;
   (c) repeating steps (a) and (b) at least once; and
   (d) soaking the substrate in the polyanions.

8. The method of claim 7, wherein the polyanions is selected from the group consisting of PAA (polyacrylic acid), PMA (Polymethacrylic acid), and PTAA (poly(3-thiopheneacetic acid) (PTAA)) solution.

9. The method of claim 7, wherein the polycations is selected from the group consisting of PAH (polyallylamine hydrochloride), PVI+(polyvinylimidazole PVI), PVP+(poly(vinylpyrrolidone) (PVP)), and PAN (polyaniline) solution.

10. The method of claim 1, wherein the main component of the metal is copper.

11. The method of claim 1, wherein the catalytic agent is selected from the group consisting of the Na2PdCl4 solution and the Pd(NH3)4Cl2 solution.

12. The method of claim 1, wherein the vibration generation module is a bend mode PZT plate.

13. The method of claim 1, wherein the substrate equips a temperature control module to modulate the substrate temperature.

14. The method of claim 1, wherein the vibration generation module includes at least one vibration component, to generate various frequency and amplitudes.

15. A method of forming a metal wire by microdispensing a pattern, which comprises the steps of:
   (a) providing a substrate has been treated;
   (b) microdispensing a catalytic agent on the surface of the substrate at places for forming a metal wire, rendering a catalytic pattern;
   (c) forming a metal for forming the metal wire on the catalytic pattern by an electroless plating process;
   (d) repeating the step of (b) and (c) at least once, to form a plurality of catalyst-metal bilayers on the substrate; and
   (e) inducing a vibration in a period of ink-jet discharging and ink drying during the step of microdispensing; wherein the vibration is generated by an apparatus which comprises:
      a supportive frame, which supports the substrate; and
      a vibration generation module, which provides a vibration in a period of catalyst drying to flatten the catalytic pattern on the surface of the substrate.

16. The method of claim 15 further comprising the step of treating a surface of the substrate to form a self-assembled monolayer (SAM) on the substrate surface for the catalytic agent to be effectively adsorbed thereon.

17. The method of claim 16, wherein the step of treating a surface of the substrate comprises the steps of:
   (a) soaking the substrate in polyanions;
   (b) soaking the substrate in polycations;
   (c) repeating steps (a) and (b) at least once; and
   (d) soaking the substrate in the polyanions.

18. The method of claim 17, wherein the polyanions is selected from the group consisting of PAA (polyacrylic acid), PMA (Polymethacrylic acid), and PTAA(poly(3-thiopheneacetic acid) solution.

19. The method of claim 17, wherein the polycations is selected from the group consisting of PAH (polyallylamine hydrochloride), PVI+(polyvinylimidazole PVI), PVP+(poly(vinylpyrrolidone) (PVP)), and PAN (polyaniline) solution.

20. The method of claim 17, wherein the substrate is selected from the group consisting of a glass substrate, a PET substrate, an FR-4 substrate, a flexible FR-4 substrate, and a polyimide substrate.

21. The method of claim 16, wherein the step of treating a surface of the substrate comprises the steps of:
   (a) soaking the substrate in polycations;
   (b) soaking the substrate in polyanions;
   (c) repeating steps (a) and (b) at least once; and
   (d) soaking the substrate in the polyanions.

22. The method of claim 21, wherein the polyanions is selected from the group consisting of PAA (polyacrylic acid), PMA (Polymethacrylic acid), and PTAA (poly(3-thiopheneacetic acid) (PTAA)) solution.

23. The method of claim 21, wherein the polycations is selected from the group consisting of PAH (polyallylamine hydrochloride), PVI+(polyvinylimidazole PVI), PVP+(poly(vinylpyrrolidone) (PVP)), and PAN (polyaniline) solution.

24. The method of claim 15, wherein the main component of the metal is copper.

25. The method of claim 15, wherein the catalytic agent is selected from the group consisting of the Na2PdCl4 solution and the Pd(NH3)4Cl2 solution.

26. The method of claim 15, wherein the catalyst-metal bilayers are formed by the same catalyst-metal bilayers.

27. The method of claim 15, wherein the catalyst-metal bilayers are formed by different catalyst-metal bilayers.

28. The method of claim 15, wherein the vibration generation module is a bend mode PZT plate.

29. The method of claim 15, wherein the substrate equips a temperature control module to modulate the substrate temperature.

30. The method of claim 15, wherein the vibration generation module includes at least one vibration component, to generate various frequency and amplitudes.

* * * * *